(12) United States Patent
Yajima et al.

(10) Patent No.: US 11,374,189 B2
(45) Date of Patent: Jun. 28, 2022

(54) QUANTUM DOT, PHOTOELECTRIC CONVERSION ELEMENT INCLUDING THE SAME, LIGHT RECEIVING ELEMENT, PHOTOELECTRIC CONVERSION APPARATUS, MOVING OBJECT, METHOD FOR PRODUCING QUANTUM DOT, AND METHOD FOR PRODUCING PHOTOELECTRIC CONVERSION ELEMENT

(71) Applicant: CANON KABUSHIKI KAISHA, Tokyo (JP)

(72) Inventors: Takahiro Yajima, Odawara (JP); Youichi Fukaya, Tokyo (JP); Akira Shimazu, Hiratsuka (JP); Takayuki Sumida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 304 days.

(21) Appl. No.: 16/808,207

(22) Filed: Mar. 3, 2020

(65) Prior Publication Data
US 2020/0295287 A1    Sep. 17, 2020

(30) Foreign Application Priority Data

Mar. 11, 2019 (JP) .............................. JP2019-044266
Nov. 21, 2019 (JP) .............................. JP2019-210867

(51) Int. Cl.
| | |
|---|---|
| H01L 51/44 | (2006.01) |
| H01L 51/30 | (2006.01) |
| H01L 51/00 | (2006.01) |
| H01L 51/42 | (2006.01) |
| C09K 11/02 | (2006.01) |
| H04N 5/341 | (2011.01) |
| H04N 5/378 | (2011.01) |
| H01L 27/30 | (2006.01) |
| C09K 11/66 | (2006.01) |

(52) U.S. Cl.
CPC .......... *H01L 51/447* (2013.01); *C09K 11/661* (2013.01); *H01L 27/307* (2013.01); *H01L 51/0007* (2013.01); *H01L 51/0028* (2013.01); *H01L 51/426* (2013.01); *H01L 51/442* (2013.01); *H04N 5/341* (2013.01); *H04N 5/378* (2013.01)

(58) Field of Classification Search
None
See application file for complete search history.

(56) References Cited

U.S. PATENT DOCUMENTS 9,324,562 B1    4/2016  Luther

OTHER PUBLICATIONS

Ruili Wang, et al, Colloidal quantum dot ligand engineering for high performance solar cells, Energy & Environmental Science, 2016, 4, 1117-1516.

*Primary Examiner* — Mark T Monk
(74) *Attorney, Agent, or Firm* — Canon U.S.A., Inc., IP Division

(57) ABSTRACT

A quantum dot includes an inorganic particle, and an organic ligand and an inorganic ligand on a surface of the inorganic particle, and the molar percentage of the inorganic ligand relative to the total amount of the inorganic ligand and the organic ligand is 25% or more and 99.8% or less.

20 Claims, 7 Drawing Sheets

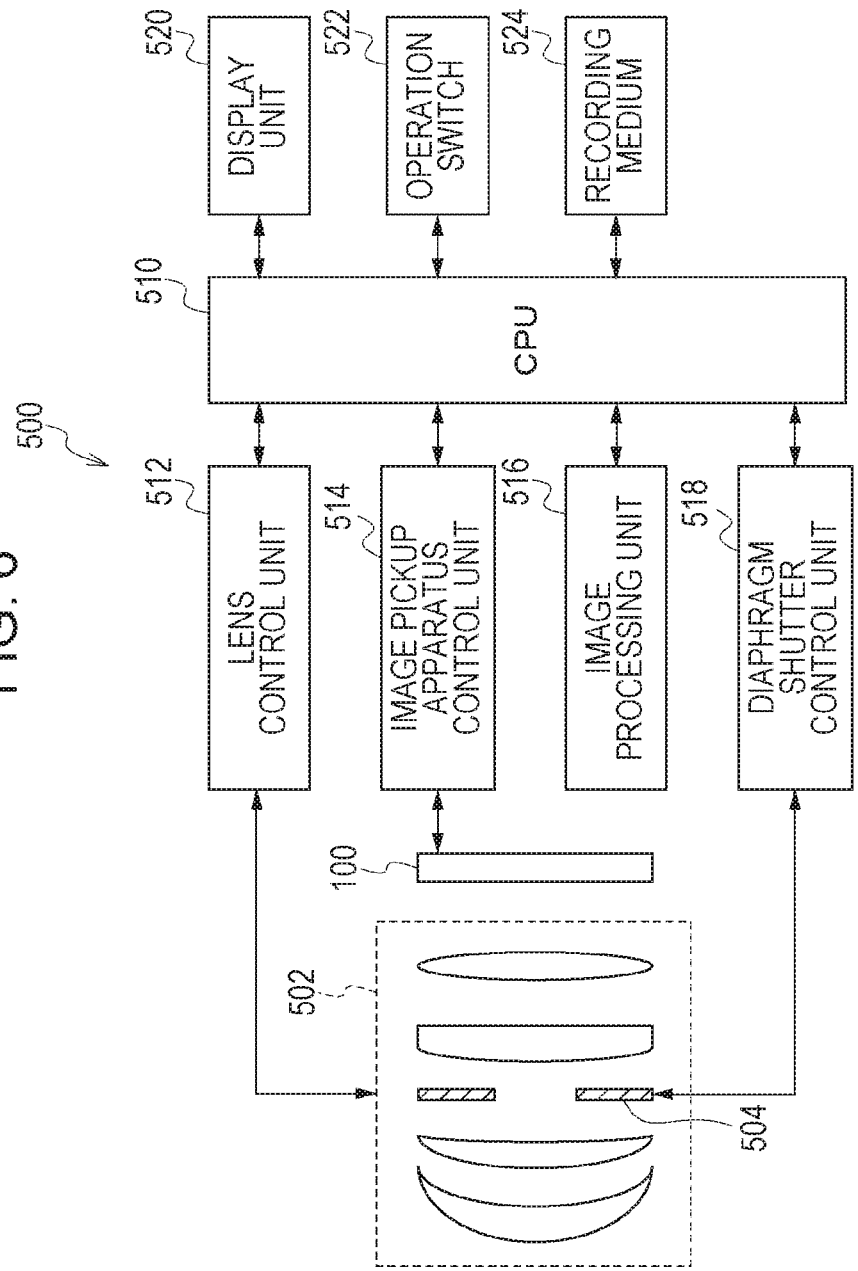

QUANTUM DOT, PHOTOELECTRIC CONVERSION ELEMENT INCLUDING THE SAME, LIGHT RECEIVING ELEMENT, PHOTOELECTRIC CONVERSION APPARATUS, MOVING OBJECT, METHOD FOR PRODUCING QUANTUM DOT, AND METHOD FOR PRODUCING PHOTOELECTRIC CONVERSION ELEMENT

BACKGROUND OF THE INVENTION

Field of the Invention

The present disclosure relates to a quantum dot, a photoelectric conversion element including the quantum dot, a light receiving element, a photoelectric conversion apparatus, a moving object, a method for producing a quantum dot, and a method for producing a photoelectric conversion element.

Description of the Related Art

Quantum dots, which are formed of inorganic particles and convert received light into electricity, have been receiving attention. Quantum dots have photosensitivity also in the near-infrared region and provide highly sensitive images even in darkness, and thus can be used for image sensors (image capturing sensors) for security applications such as surveillance cameras.

Quantum dot materials are known to be formed of a plurality of inorganic particles made of a compound semiconductor. A molecule disposed on the surface of nanoparticles and binding to the nanoparticles through a covalent bond is called a ligand.

A quantum dot is known to have on its surface an organic ligand and an inorganic ligand, and it is known that the characteristics of a quantum dot can be controlled by the type of ligand. For example, an organic ligand such as benzenedithiol containing a benzene ring is known to improve the electrical conductivity of inorganic particles. However, such an organic ligand has a three-dimensional structure and thus can be bulky, and a bulky ligand cannot sufficiently cover inorganic particles. Consequently, surface defects of the inorganic particles sometimes cannot sufficiently be suppressed.

Halide inorganic ligands, due to the small sizes of halogen atoms, are able to cover the surface of inorganic particles more than organic ligands and thus can suppress surface defects of the inorganic particles. However, in the case of an inorganic ligand alone, the distance between adjacent inorganic particles may be as small as the size of a halogen atom. That is, the inorganic ligand does not sufficiently function as a spacer, and thus heat resistance may be low.

When a quantum dot film is formed and then oxidized in the atmosphere, the oxidation proceeds to core portions of inorganic particles, and the particle size of the inorganic particles decreases. It is known that if the particle size of nanoparticles decreases, a change in electrical conductivity occurs, and in particular, the spectrum of photosensitivity shifts toward shorter wavelengths, thus resulting in a decrease in photosensitivity in a desired wavelength region.

U.S. Pat. No. 9,324,562 (hereinafter PTL1) discloses improving the stability of a quantum dot by replacing organic matter bonded to the surface of the quantum dot with inorganic matter having a halogen.

Ruili Wang, et. al, "Colloidal quantum dot ligand engineering for high performance solar cells", Energy & Environmental Science, 2016, 4, 1117-1516 (hereinafter NPTL 1) discloses adding a halide inorganic ligand when disposing an organic ligand on the surface of a quantum dot. NPTL 1 discloses that adding an inorganic ligand repairs nanoparticle surface defects, where a ligand having a relatively large molecular length, such as oleic acid, is not bonded although added during synthesis, to thereby provide a quantum dot film with improved electrical conductivity.

PTL1 and NPTL1 disclose quantum dots including inorganic particles having on their surface an inorganic ligand and an organic ligand. However, since it is estimated from the conditions for producing these quantum dots that the molar percentage of the organic ligand is higher than the molar percentage of the inorganic ligand, the quantum dots are estimated to have low photocurrent densities. Thus, there has been a need for improvements in photocurrent density.

SUMMARY OF THE INVENTION

The present disclosure has been made in view of the above disadvantages and provides a quantum dot having a photocurrent density increased by improving the molar percentages of inorganic and organic ligands disposed on the quantum dot.

An embodiment of the present disclosure provides a quantum dot including an inorganic particle and including an organic ligand and an inorganic ligand on a surface of the inorganic particle. The molar percentage of the inorganic ligand relative to the total amount of the inorganic ligand and the organic ligand is 25% or more and 99.8% or less.

Further features of the present disclosure will become apparent from the following description of exemplary embodiments with reference to the attached drawings.

BRIEF DESCRIPTION OF THE DRAWINGS

FIG. 6 illustrates an example of an image pickup system including a photoelectric conversion element according to an embodiment of the present disclosure.

DESCRIPTION OF THE EMBODIMENTS

Figure 1A:
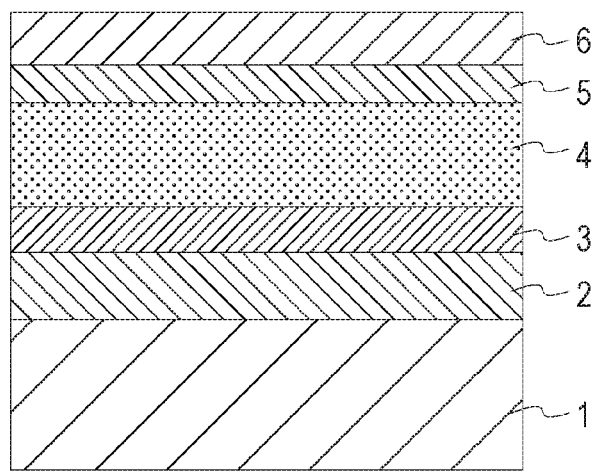
FIG. 1A is a schematic sectional view illustrating a photoelectric conversion element according to an embodiment of the present disclosure.

A quantum dot according to an embodiment of the present disclosure includes a plurality of inorganic particles. The quantum dot has on its surface an organic ligand and an inorganic ligand, and the molar percentage of the inorganic ligand relative to the total amount of the inorganic ligand and the organic ligand is 25% or more and 99.8% or less. The molar percentage of the inorganic ligand may be 75% or more and 98% or less relative to the total amount of the inorganic ligand and the organic ligand. The height of a maximum peak attributed to the inorganic ligand as determined by TOF-SIMS may be at least three times the height of a maximum peak attributed to the organic ligand as determined by TOF-SIMS. In the TOF-SIMS measurement, the principal component of the inorganic particles may be used as a reference. When the principal component of the inorganic particles is used as a reference, the peak of the inorganic particles may be at 90% or more of a measuring range. The peak of the inorganic particles may be exactly at the limit of the measuring range.

The inorganic ligand suppresses a decrease in photosensitivity of the quantum dot that may be caused by denaturation due to, for example, oxidation, and thus the quantum dot has high conductivity.

The molar percentages of the ligands disposed on the surface of the quantum dot can be controlled by the conditions employed when the ligands are applied to the quantum dot.

The ligands may be added such that the molar percentage of the inorganic ligand is higher than the molar percentage of the organic ligand. More specifically, the amount of the inorganic ligand added relative to the total amount of the inorganic ligand added and the organic ligand added may be larger than the amount of the organic ligand added and may be 25% or more and 99.8% or less.

Material of Quantum Dot

The quantum dot is formed of inorganic particles. The particles need not necessarily be perfectly spherical. The inorganic particles used for the quantum dot may also be referred to as nanoparticles for their size. Examples of materials of the quantum dot include nanoparticles of group IV semiconductors, which are semiconductor crystals, group III-V compound semiconductors, group II-VI compound semiconductors, and compound semiconductors composed of a combination of three or more elements selected from group II, group III, group IV, group V, and group VI elements. Specific examples include semiconductor materials having a relatively narrow band gap, such as PbS, PbSe, InN, InAs, Ge, InAs, InGaAs, CuInS, CuInSe, CuInGaSe, InSb, Si, and InP. Of these materials, the quantum dot material may be formed of nanoparticles containing Pb, more specifically PbS or PbSe, for reasons of ease of synthesis and photosensitivity in a region extending to the infrared region. The quantum dot may have a core-shell structure having such a quantum dot material as a nucleus (core) and a cover compound covering the quantum dot material. In this case, ligands are disposed on the shell portion.

The average particle size of the quantum dot may be 2 nm or more and 15 nm or less. The quantum dot, when having a small particle size equal to or less than the Bohr radius of an intrinsic exciton, experiences a phenomenon in which the band gap of the quantum dot changes due to the quantum size effect. For example, in the case of group II-VI semiconductors, the Bohr radius is relatively large, and in the case of PbS, the Bohr radius is said to be about 18 nm. In the case of InP, which is a group III-V semiconductor, the Bohr radius is said to be about 10 nm to 14 nm. That is, when the average particle size of the quantum dot is 15 nm or less, band gap control due to the quantum size effect can be achieved whether PbS or InP is used. When the average particle size of the quantum dot is 2 nm or more, crystal growth of the quantum dot can be easily controlled in synthesizing the quantum dot.

Ligands on Quantum Dot Surface

Organic Ligand

The quantum dot has ligands on its surface. The ligands are broadly classified into an inorganic ligand and an organic ligand. When a first quantum dot and a second quantum dot are present, the organic ligand may have a cross-linking structure that cross-links the two quantum dots. Cross-linking means that a molecule binds to the first quantum dot and the second quantum dot. When the quantum dots are cross-linked through the organic ligand, the distance between the quantum dots can be controlled by the choice of molecular length of the organic ligand. Specifically, the cross-linking structure may be a hydroxyl group, a thiol group, or a carboxyl group. Here, quantum dots cross-linked through a hydroxyl group are linked through an ether bond, quantum dots cross-linked through a thiol group are linked through a sulfur atom, and quantum dots cross-linked through a carboxyl group are linked through an ester bond. By cross-linking the quantum dots through the organic ligand, the distance therebetween can be kept constant.

At least one organic molecule may be present between the quantum dots. Assuming that the quantum dots are arranged without space, the number of quantum dots adjacent to one quantum dot is 12 in the case of a face-centered cubic lattice and 8 in the case of a body-centered cubic lattice. That is, one quantum dot may have at least 8 to 12 organic ligands for cross-linking with other quantum dots.

When the number of organic ligands composed of organic molecules is large, both ends of each organic molecule are strongly bonded to quantum dot surfaces, thus leading to improved heat resistance and hence increased stability of electrical characteristics. However, when the molar ratio of inorganic ligand to organic ligand is small, the number of inorganic ligands covering surface defects of the quantum dots is disadvantageously small.

Inorganic Ligand

The inorganic ligand may be bonded to a quantum dot surface. The coexistence of the inorganic ligand on the quantum dot surface improves carrier mobility. The inorganic ligand reduces surface defects of the quantum dots. Photocarriers generated in a quantum dot film are able to move according to the electric field without delay. Therefore, the photocarriers can be effectively taken out to an external electrode. That is, the presence of the inorganic ligand improves external quantum efficiency.

On the other hand, an excessive amount of inorganic ligand is not preferred. When the amount of inorganic ligand applied in the liquid phase is large, the inorganic ligand can move around relatively freely on the surface of the quantum dots during heating. A movement of the inorganic ligand on the surface of the quantum dots shortens the distance between adjacent quantum dots to cause fusion (necking) of the quantum dots, resulting in a great change in, for example, electrical characteristics. For example, when the number of halogen atoms such as iodine is excessive, the quantum dots are fused to each other by heating a photoelectric conversion film to 140° C. or higher to form a portion where the size of some quantum dots is large, resulting in a change in device characteristics. An increase in quantum dot size causes changes in optical absorbance and electronic state, thus resulting in a decrease in stability of device characteristics.

Iodine, which is a halogen atom, has a diameter of 0.28 nm and thus has a projected area of 0.06 nm². Herein, the quantum dot is assumed to be spherical. When the particle size (diameter) of the quantum dot is 3 nm, the surface area of the quantum dot is 28.26 nm².

From the surface area of the quantum dot and the projected area of iodine, the number of iodine atoms covering the surface is 471. In the case of closest packing, the number of iodine atoms is approximately 349 because the filling ratio (fill factor) of spheres in a cube is 74%.

Ratio of Inorganic Ligand to Organic Ligand

The diameter of a benzene ring is 0.28 nm, and the projected areas of an iodine ion and the benzene ring are substantially the same. The size of 1,3-BDT, which is an example of an organic ligand, is substantially equal to the size of the benzene ring, and thus the projected area of 1,3-BDT is 0.06 nm². When the organic ligand is disposed in each space between the quantum dots in a close packed structure, the number thereof was 8 or 12.

Comparison with 349, which is the number of iodine (inorganic ligand) atoms covering a quantum dot surface, shows that the molar percentage of the inorganic ligand relative to the organic ligand is 96.6% to 97.7%. That is, the molar percentage of the inorganic ligand is 98%.

Minimum Molar Percentage of Inorganic Ligand Relative to Total Amount of Inorganic Ligand and Organic Ligand FIGS. 2B to 2E schematically illustrate surfaces of quantum dots. Areas surrounded by dashed line are parts of the quantum dots. Using the four figures, a minimum molar percentage of the inorganic ligand relative to the total amount of the inorganic ligand and the organic ligand will be described.

Figure 2A:
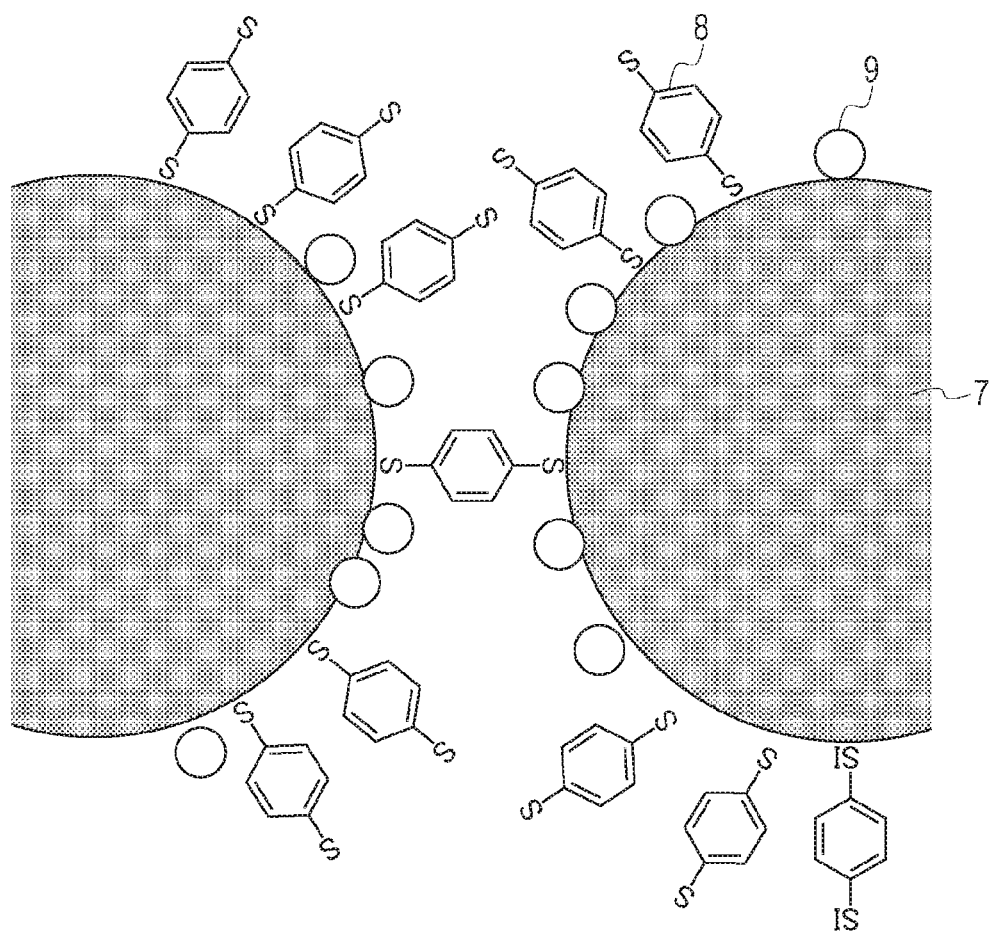
FIG. 2A is a schematic view illustrating examples of an inorganic ligand and an organic ligand of a quantum dot according to an embodiment of the present disclosure.
Figure 2B:
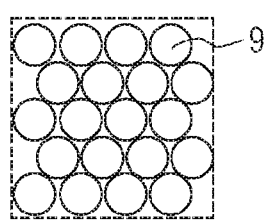
FIGS. 2B to 2E schematically illustrate surfaces of quantum dots.
Figure 2C:
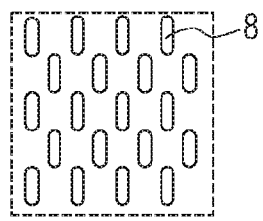

In FIG. 2B, the inorganic ligands are disposed on a quantum dot surface without space. In FIG. 2C, the organic ligands are disposed on a quantum dot surface without space.

The thickness of one carbon atom constituting the organic ligand is about 0.08 nm, which is smaller than the thickness of a halogen atom serving as the inorganic ligand, 0.26 nm, and thus the projected area of the organic ligand can be said to be smaller than that of the inorganic ligand.

The projected area of the organic ligand stood upright is 0.02 nm², which is ⅓ of the projected area of the halogen atom, 0.06 nm².

For defect reduction and carrier transportation, at least one halogen atom per organic ligand may be disposed on a quantum dot surface. That is, the molar percentage of the inorganic ligand relative to the organic ligand may be 50% or more.

Figure 2D:
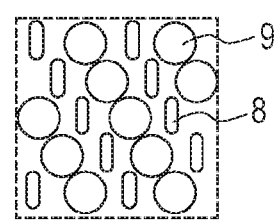

In FIG. 2D, the inorganic ligands and the organic ligands are disposed on a quantum dot surface in a ratio of 1:1. When the inorganic ligands and the organic ligands are disposed at the same molar percentage, spaces are left around the organic ligands. To fill the spaces, it is effective to dispose a larger number of the organic ligands.

Figure 2E:
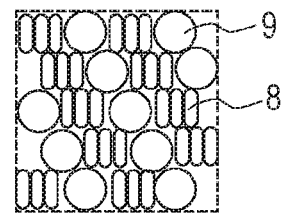

In FIG. 2E, the inorganic ligands and the organic ligands are disposed on a quantum dot surface in a ratio of 1:3. For arrangement without space, it is effective to dispose three organic ligands per inorganic ligand. That is, when the molar percentage of the inorganic ligand is 25% or more relative to the total amount of the organic ligand and the inorganic ligand, a great effect can be produced.

Synthesis of Quantum Dot

PbS particles, an example of the quantum dot, may be produced, for example, as described below. In a three-necked flask, lead (II) oxide as a lead (Pb) precursor solution, oleic acid as an organic ligand, and octadecene as a solvent are placed. The three-necked flask is purged with nitrogen, and the Pb precursor solution is heated to 90° C. in an oil bath to effect reaction between the lead oxide and the oleic acid. Thereafter, the reaction product is heated to 120° C. to form and grow PbS quantum dots. A solution of bistrimethylsilyl sulfide in octadecene as a sulfur (S) precursor solution is separately prepared. The S precursor solution is rapidly injected into the Pb precursor solution heated to 120° C. to effect reaction. After completion of the reaction, the reaction product is naturally cooled to room temperature, and methanol or acetone as a polar solvent is added thereto. The resulting mixture is centrifuged to precipitate PbS particles. After the supernatant is removed, toluene is added to redisperse the PbS particles. This washing step involving centrifugation and redispersion is repeated several times to remove an excess of oleic acid and unreacted substances. Lastly, a solvent such as octane is added to provide a quantum dot dispersion in which the quantum dots are dispersed.

Using, for example, a method described in NPTL 1, a halide inorganic ligand containing a halogen atom can be added to the PbS particles, an example of the quantum dot. Specifically, tetrabutylammonium iodide $C_{16}H_{36}NI$: TBAI is used as the halide ligand. After the S precursor solution was rapidly injected into the above-described Pb precursor solution heated to 120° C. to effect reaction, a precursor solution prepared using the halide ligand TBAI was added to the reaction product. The percentages of oleic acid and the halogen atom can be adjusted by adjusting the reaction temperature and the amount of addition of the halide ligand.

The inorganic ligand may be applied in the liquid phase, and the organic ligand may be applied in the solid phase.

Organic Ligand with Long Molecular Chain Length

The organic ligand is a ligand formed of an organic compound. The organic ligand may be constituted by an organic compound having a boiling point of 200° C. or higher. The ligand contained in the quantum dot dispersion serves as a ligand that coordinates to the quantum dots, and, in addition, because of having a molecular structure likely to cause steric hindrance, the ligand also acts as a dispersant that disperses the quantum dots in a solvent. Ligands include ligands with longer molecular chain lengths and ligands with shorter molecular chain lengths. In the case of a molecule having a branched structure, whether the molecular chain length is long or short is determined by the length of the main chain. In the first place, ligands with short molecular chain lengths can hardly be dispersed in an organic solvent system. Herein, the term "dispersed" means a state with no particle precipitation and no turbidity. To improve the dispersion of the quantum dots, the ligand with a long molecular chain length is preferably a ligand having at least 6 main-chain carbon atoms, more preferably a ligand having 10 or more main-chain carbon atoms. Specifically, the ligand with a long molecular chain length may be a saturated compound or an unsaturated compound, and examples include decanoic acid, lauric acid, myristic acid, palmitin acid, stearic acid, behenic acid, oleic acid, erucic acid, oleylamine, dodecylamine, dodecanethiol, 1,2-hexadecanethiol, trioctylphosphine oxide, and cetrimonium bromide. The ligand with a long molecular chain length may be unlikely to remain in a photoelectric conversion film during the film formation. To reduce the likelihood of remaining in the photoelectric conversion film while providing the quantum dots with dispersion stability, at least one of oleic acid and oleylamine is particularly preferred.

The quantum dot solvent contained in the quantum dot dispersion is not particularly limited, but may be a solvent that hardly dissolves the quantum dots and readily dissolves the ligand with a long molecular chain length. The quantum dot solvent may be an organic solvent, and specific examples include alkanes [e.g., n-hexane, n-octane], benzene, and toluene.

Organic Ligand with Relatively Short Molecular Chain Length

The organic ligand is a ligand formed of an organic compound. The organic ligand may be constituted by an organic compound having a boiling point of 200° C. or higher. The organic ligand with a relatively short molecular chain length has a shorter molecular chain length than the ligand with a long molecular chain length and is at least one ligand selected from ligands such as organic compounds including ethanedithiol, benzenedithiol, dibenzenedithiol, mercaptobenzoic acid, dicarboxybenzene, benzenediamine, and dibenzenediamine More specifically, the organic ligand with a relatively short molecular chain length may be selected from 1,3-benzenedithiol, 1,4-benzenedithiol, 3-mercaptobenzoic acid, and 4-mercaptobenzoic acid. In particular, ligands such as benzenedithiol containing a benzene ring have a boiling point of higher than 200° C. and thus are preferred. Such a ligand is less likely to evaporate even at high temperatures of 140° C. or higher and thus provides a quantum dot film with high heat resistance. The ligand solvent contained in the ligand solution is not particularly limited, but is preferably an organic solvent having a high dielectric constant, particularly preferably ethanol, acetone, methanol, acetonitrile, dimethylformamide, dimethylsulfoxide, butanol, propanol, and the like.

Inorganic Ligand

The inorganic ligand is a ligand formed of an inorganic compound. The inorganic ligand may contain a halogen atom. The inorganic ligand containing a halogen atom is at least one ligand selected from ligands such as lead fluoride: $PbF$, lead (II) chloride: $PbCl_2$, lead (II) iodide: $PbI_2$, and lead (II) bromide: $PbBr_2$. When a large amount of such an inorganic ligand made of a halide inorganic material is contained, the surface of the quantum dots can be sufficiently covered. Halogen atoms have a small particle size and thus are able to seal more surface defects.

Photoelectric Conversion Element

Figure 1B:
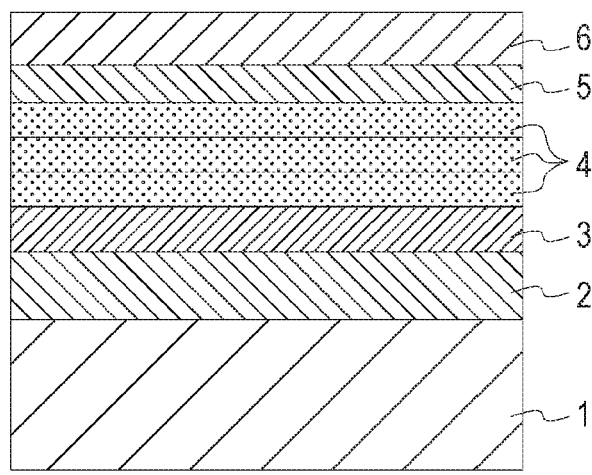
FIG. 1B is a schematic sectional view illustrating an example of a photoelectric conversion element according to an embodiment of the present disclosure including photoelectric conversion layers stacked on top of each other.

FIG. 1 is an example of a schematic sectional view of a photoelectric conversion element according to an embodiment of the present disclosure. The photoelectric conversion element includes a substrate 1, a first electrode layer 2 on the substrate 1, a first interface layer 3 on the first electrode layer 2, a photoelectric conversion layer 4 on the first interface layer 3, a second interface layer 5 on the photoelectric conversion layer 4, and a second electrode 6 on the second interface layer 5. The first electrode and the second electrode may be collectively referred to as a pair of electrodes.

A photoelectric conversion element according to an embodiment of the present disclosure includes a first electrode, a second electrode, and a photoelectric conversion layer disposed between the first electrode and the second electrode. The photoelectric conversion layer converts received light into electric charges. The electric charges produced as a result of conversion are polarized and collected by either one of the pair of electrodes. The photoelectric conversion layer may be configured such that electric fields are applied from the first electrode and the second electrode. The pair of electrodes is composed of an electrode that collects holes and an electrode that collects electrons. The electrode that collects holes may also be referred to as a positive electrode or a cathode. The electrode that collects electrons may also be referred to as a negative electrode or an anode. At least one of the pair of electrodes may be transparent.

In the photoelectric conversion element, an interface layer may be disposed between the photoelectric conversion layer and at least one of the pair of electrodes. The interface layer may be an electron blocking layer, which is a layer that inhibits electrons from transferring from the photoelectric conversion layer to the cathode, or a hole blocking layer, which is a layer that inhibits holes from transferring from the photoelectric conversion layer to the anode.

Photoelectric Conversion Layer

The photoelectric conversion layer can be formed by providing the quantum dots on the electrode, the substrate, or the like. The photoelectric conversion layer containing an aggregate of nanoparticles (the quantum dots) may be produced by any method. When dispersed in a solvent while being modified by a ligand with a long molecular chain length, such as oleic acid, the quantum dots are less likely to be in the form of an aggregated bulk. The quantum dot dispersion may be provided on the substrate by any method, for example, application of the quantum dot dispersion onto the substrate or immersion of the substrate into the quantum dot dispersion. More specifically, the quantum dot dispersion can be applied onto the substrate by a liquid phase method such as a spin coating method, a casting method, a dip coating method, a blade coating method, a spray coating method, an ink jet method, a dispenser method, a screen printing method, a letterpress printing method, or an intaglio printing method. In particular, the ink jet method, the dispenser method, the screen printing method, the letterpress printing method, and the intaglio printing can pattern a coating film at any position on the substrate.

After the quantum dot dispersion is provided on the substrate, the ligand solution is further provided thereon to perform ligand exchange, whereby the photoelectric conversion layer can be formed. By providing the quantum dot dispersion on the substrate, the aggregate of the quantum dots is configured such that the quantum dots are arrayed. After the aggregate of the quantum dots is formed, ligand exchange for changing to an organic ligand with a relatively short molecular chain length may be performed to shorten the interval between the quantum dots. However, when the dot-to-dot distance (interval) of the quantum dots is large, electrical conductivity may be reduced. Reducing the interval enables a compact arrangement of the quantum dots. Reducing the interval can also improve electrical conductivity to provide a photoelectric conversion film with a large photocurrent. However, as the interval decreases, the likelihood of fusion (referred to as necking) of the quantum dots increases, and thus there may be a certain degree of distance. Fusion of the quantum dots results in larger quantum dots and a narrower band gap, thus resulting in a lower resistance value and a significantly increased dark current.

Repeatedly performing the quantum dot aggregate formation and the ligand exchange can suppress the occurrence of cracking in the photoelectric conversion film containing the aggregate of the quantum dots, enhance electrical conductivity, and increase the thickness of the photoelectric conversion film. A washing step may be performed to remove, for example, an excess of ligands, ligands separated from the quantum dots, residual solvent, and other impurities. Specifically, at least one of the quantum dot solvent and the ligand solvent is applied to the substrate on which the quantum dot aggregate or the photoelectric conversion layer is formed, or the substrate is immersed in at least one of the quantum dot solvent and the ligand solvent.

The formation of the photoelectric conversion layer may include, for example, a dispersion drying step for drying the quantum dot dispersion and a solution drying step for drying the ligand solution. The drying is performed in such a manner that after the quantum dot aggregate is formed in the form of a photoelectric conversion film, heating is performed to a temperature for drying solvent remaining in the quantum dot aggregate. After the ligand exchange step, heating is performed to a solution drying temperature for drying the ligand solution. Alternatively, leaving to stand at room temperature may be employed. Heating may be performed in a nitrogen atmosphere containing a trace of oxygen. Specifically, heating is performed in an environment containing 1% or less oxygen, whereby the surface of the quantum dots is oxidized. The surface of the quantum dots will be oxidized even if heating is performed with moisture being slightly remaining on the uppermost surface of the photoelectric conversion film. Moreover, the presence of a trace of moisture in the quantum dot dispersion or the ligand solution is also preferred for surface oxidation. The concentration of oxygen generated by surface oxidation may be 0.1 ppm or more.

The surface of the quantum dots is the uppermost surface of a semiconductor material, and a bond not binding to any ligand is a dangling bond (a dangling bond on an atom), which forms a crystal lattice defect level which may cause carrier trapping which has an influence on electrical conductivity. By oxidizing the surface of the quantum dots, dangling bonds on the surface can be sealed, and the crystal lattice defect level can be reduced. The reduction of the crystal lattice defect level can reduce dark current, improve photocurrent density, and improve photosensitivity.

However, if surface oxidation of the quantum dots proceeds too far, the particle size of substantial nanoparticles that contribute to the quantum confinement effect as the quantum dots decreases. If the particle size of the nanoparticles decreases, a change in electrical conductivity occurs, and in particular, the spectrum of photosensitivity shifts toward shorter wavelengths, thus affecting photosensitivity.

The photoelectric conversion layer may have any thickness, but to provide high electrical conductivity, the thickness is preferably 10 nm or more, more preferably 50 nm or more. In view of the possibility of excessive carrier concentration and the ease of production, the thickness of the photoelectric conversion layer is preferably 600 nm or less.

In addition, the inorganic ligand preferentially covers the surface of nanoparticles constituting a quantum dot film, and thus surface defects of the quantum dots that cannot be covered by the organic ligand alone can be reduced. Reducing surface defects of the nanoparticles can suppress an increase in dark current and a decrease in photocurrent to provide a light detecting element with high photosensitivity.

Due to the use of the ligands having a boiling point of 200° C. or higher, high heat resistance can be provided.

The light detecting element is made of a material in which the plurality of nanoparticles are each composed of a nucleus and a surface layer, the surface layer of each nanoparticle being composed of an oxidation layer containing a halogen and an organic layer containing organic matter. Due to the presence of the organic matter and the oxidation layer containing a halogen, oxygen molecules entering from outside the element are captured, and this self-oxidation can suppress surface oxidation of the nanoparticles.

The quantum dot film contains at least any one of an oxidized benzene ring, an oxidized hydrocarbon, and oxidized organic matter. The organic ligand captures oxygen molecules to form an oxidized benzene ring or an oxidized hydrocarbon, and as a result, a carrier hopping site constituted by the benzene ring becomes ineffective to suppress dark current.

In the light detecting element, the plurality of nanoparticles are selected from PbS and PbSe, which contain lead. Due to the use of PbS or PbSe, which contains lead, the light detecting element has photosensitivity also in the infrared region.

An electronic device such as a photoelectric conversion element, a light emitting diode, a light detecting element, a light receiving element array, an image sensor, or an image pickup apparatus is solder mounted on, for example, a printed circuit board to be put to practical use. In the solder mounting step, a heating process at about 200° C. is used. An electronic device such as an image sensor or an image pickup apparatus is put in a package made of resin or ceramic and sealed with glass for waterproofing and dustproofing. In the package mounting step, the electronic device is fixed with an adhesive and then electrically connected with a lead-out wire of the package, for example, by wire bonding using a thin gold wire. For curing the adhesive and for the wire bonding, a heating process at 145° C. or higher is used.

Furthermore, when used as an image sensor or an image pickup apparatus in the visible light region, a color filter capable of splitting light into red, green, and blue components and a microlens for focusing light are used. The color filter and the microlens are often formed of resin, and a heating process at 150° C. or higher is used for curing the resin. The quantum dot material for use as an image sensor or an image pickup apparatus is required to have heat resistance sufficient to withstand the temperatures in the heating processes in the mounting step, the color filter step, and the microlens step described above.

Therefore, disposing ligands having a high boiling point can provide a quantum dot having high heat resistance, and such a quantum dot having high heat resistance can be used for various apparatuses.

Interface Layer

To improve electrical properties, an upper interface layer and a lower interface layer may be disposed between the photoelectric conversion layer and the electrodes (upper electrode layer, lower electrode layer). A layer (electron blocking layer) that blocks electrons and conducts only holes may be formed on the electrode (positive electrode) that collects holes, and a layer (hole blocking layer) that blocks holes and conducts only electrons may be formed on the electrode (negative electrode) that collects electrons.

The electron blocking layer may be made of a material capable of efficiently transporting holes generated in the photoelectric conversion layer to the positive electrode. In view of this, the positive electrode interface layer material may have characteristics such as having high hole mobility, having high electrical conductivity, having a small hole injection barrier between the electron blocking layer and the positive electrode, and having a small hole injection barrier between the photoelectric conversion layer and a p-type semiconductor layer. Furthermore, when light is introduced into the photoelectric conversion layer through an electron blocking interface layer, the electron blocking interface layer may be made of a material with high transparency. Typically, visible light is introduced into the photoelectric conversion layer, and thus a transparent electron blocking interface layer material having a visible light transmittance of typically 60% or more, particularly 80% or more, may be used. From this viewpoint, examples of suitable electron blocking interface layer materials include p-type semiconductor materials including inorganic semiconductors such as molybdenum oxide MoO$_3$ and nickel oxide NiO.

Since the function required for the hole blocking layer is to block holes separated from the photoelectric conversion layer and transport electrons to the negative electrode, the above description on the electron blocking interface layer may be used with positive electrode replaced with negative electrode, p-type semiconductor with n-type semiconductor, and hole with electron. A configuration in which light is applied from the negative electrode side and making effective use of light reflected on the negative electrode side are also possible, and in such cases, the transmittance also needs to be high. From this viewpoint, examples of suitable hole blocking interface layer materials include n-type semiconductor materials selected from inorganic semiconductors such as titanium oxide TiO$_2$ and organic semiconductors such as fullerene and fullerene derivatives.

Electrode

The electrode may be a pair of electrodes, such as an upper electrode layer and a lower electrode layer, or a first electrode and a second electrode. The electrode can be formed of any material having conductivity. Examples of constituent materials of the electrode include metals such as platinum, gold, silver, aluminum, chromium, nickel, copper, titanium, magnesium, calcium, barium, and sodium, alloys thereof, metal oxides such as indium oxide and tin oxide, composite oxides thereof (e.g., ITO, IZO), conductive polymers such as polyacetylene, metal particles, and conductive composite materials obtained by dispersing conductive particles such as carbon black, fullerene, and carbon nanotubes in matrices such as polymer binders. One of the constituent materials of the electrode may be used alone, or two or more of them may be used in any combination at any ratio.

The electrode has a function to collect electrons and holes generated inside the photoelectric conversion layer. Thus, among the materials described above, constituent materials suitable for collecting electrons and holes may be used as the constituent materials of the electrode. Examples of electrode materials suitable for collecting holes include materials having high work functions, such as Au and ITO. Examples of electrode materials suitable for collecting electrons include materials having low work functions, such as Al. The electrode may have any thickness. The thickness is appropriately determined in view of, for example, electrode material, conductivity, and transparency and may be 10 nm or more and 100 μm or less.

Substrate

The quantum dot dispersion is applied onto a substrate. The shape, structure, size, and the like of the substrate are not particularly limited and appropriately selected depending on the intended use. The structure of the substrate may be a monolayer structure or a layered structure. The substrate may be made of, for example, an inorganic material such as glass, silicon, or stainless steel, a resin, or a resin composite material. In the case of a silicon substrate, an integrated circuit may be formed thereon. A lower electrode, an insulating film, and the like may be formed on the substrate, and in this case, the quantum dot dispersion is applied onto the lower electrode or the lower insulating film on the substrate.

When a wiring layer is formed on, for example, a silicon substrate, the substrate is meant to include the wiring layer. When an interlayer insulation layer in contact with the electrode of the photoelectric conversion element is present, the substrate is meant to include the interlayer insulation layer.

Applications of Photoelectric Conversion Element

A photoelectric conversion element according to an embodiment of the present disclosure may be used for a light receiving element. The light receiving element includes the photoelectric conversion element, a reading circuit that reads an electric charge from the photoelectric conversion element, and a signal processing circuit that receives the electric charge from the reading circuit and performs signal processing on the electric charge.

A photoelectric conversion element according to an embodiment of the present disclosure may be used for a photoelectric conversion apparatus. The photoelectric conversion apparatus includes an optical system including a plurality of lenses and a light receiving element that receives light that has passed through the optical system. The light receiving element includes the photoelectric conversion element. Specifically, the photoelectric conversion apparatus may be a digital still camera or a digital camcorder.

FIG. 6 illustrates an example of an image pickup system including a photoelectric conversion element according to an embodiment of the present disclosure. An image pickup system 500 includes, as illustrated in FIG. 6, a photoelectric conversion apparatus 100, an image pickup optical system 502, a CPU 510, a lens control unit 512, an image pickup apparatus control unit 514, an image processing unit 516, a diaphragm shutter control unit 518, a display unit 520, an operation switch 522, and a recording medium 524.

The image pickup optical system 502 is an optical system for forming an optical image of an object and includes, for example, a lens group and a diaphragm 504. The diaphragm 504 has a function to adjust the amount of light in photographing by adjusting the aperture diameter of the diaphragm and also functions as a shutter for exposure time adjustment in still image photographing. The lens group and the diaphragm 504 are held so as to move back and forth along the optical axis direction. Through the cooperative movement of the lens group and the diaphragm 504, a scaling function (zoom function) and a focus adjustment function are implemented. The image pickup optical system 502 may be integrated with the image pickup system or may be an image pickup lens attachable to the image pickup system.

The photoelectric conversion apparatus 100 is disposed in such a manner that the image pickup area thereof is located in the image space of the image pickup optical system 502. The photoelectric conversion apparatus 100 is a photoelectric conversion apparatus according to an embodiment of the present disclosure and includes a CMOS sensor (pixel unit) and a peripheral circuit (peripheral circuit region). In the photoelectric conversion apparatus 100, a plurality of pixels each having a photoelectric conversion unit are two-dimensionally arranged, and a color filter is disposed in each of these pixels to configure a two-dimensional single-plate color sensor. The photoelectric conversion apparatus 100 performs photoelectric conversion on an object image formed by the image pickup optical system 502 and outputs the resultant in the form of an image signal or a focus detection signal.

The lens control unit 512 controls back-and-forth driving of the lens group of the image pickup optical system 502 to perform a scaling operation and focus adjustment and includes a circuit and a processor for implementing this function. The diaphragm shutter control unit 518 adjusts the amount of light in photographing by changing the aperture diameter of the diaphragm 504 (with a variable aperture value) and includes a circuit and a processor for implementing this function.

The CPU 510 is a control device disposed in a camera and manages various controls of the camera main body. The CPU 510 includes, for example, an arithmetic operation unit, a ROM, a RAM, an A/D converter, a D/A converter, and a communication interface circuit. The CPU 510 controls operations of the units in the camera according to a computer program stored, for example, in the ROM to perform a series of photographing operations such as auto-focusing (AF) including detection of a focus state of the image pickup optical system 502 (focus detection), image capturing, image processing, and recording. The CPU 510 also serves as a signal processing unit.

The image pickup apparatus control unit 514 controls operations of the photoelectric conversion apparatus 100, and also performs A/D conversion on a signal output from the photoelectric conversion apparatus 100 and transmits the converted signal to the CPU 510. The image pickup apparatus control unit 514 includes a circuit and a control device for implementing these functions. The photoelectric conversion apparatus 100 may have the A/D conversion function. The image processing unit 516 performs image processing such as y conversion and color interpolation on an A/D converted signal to generate an image signal and includes a circuit and a control device for implementing this function. The display unit 520 is a display such as a liquid crystal display (LCD) and displays, for example, information about a photographing mode of the camera, a preview image before photographing, an image for checking after photographing, and an in-focus state at the time of focus detection. The operation switch 522 includes, for example, a power switch, a release (photographing trigger) switch, a zoom operation switch, a photographing mode selection switch. The recording medium 524 records a captured image and the like and may be built in the image pickup system or may be a detachable medium such as a memory card.

Thus, by using the photoelectric conversion apparatus 100 according to an embodiment of the present disclosure in the image pickup system 500, a high-performance image pickup system can be provided.

A photoelectric conversion apparatus according to an embodiment of the present disclosure may be used for a moving object. The moving object includes a body provided with the photoelectric conversion apparatus and a moving unit configured to move the body. Specific examples of such a moving object includes automobiles, aircraft, ships, and drones. The photoelectric conversion apparatus disposed in a moving object may image surroundings to support operations of the moving object. The body can be formed of metal or carbon fiber. For the carbon fiber, polycarbonate may be used, for example. Examples of the moving unit include tires, magnetic floating, and jet mechanisms using fuel vaporization.

Figure 7A:
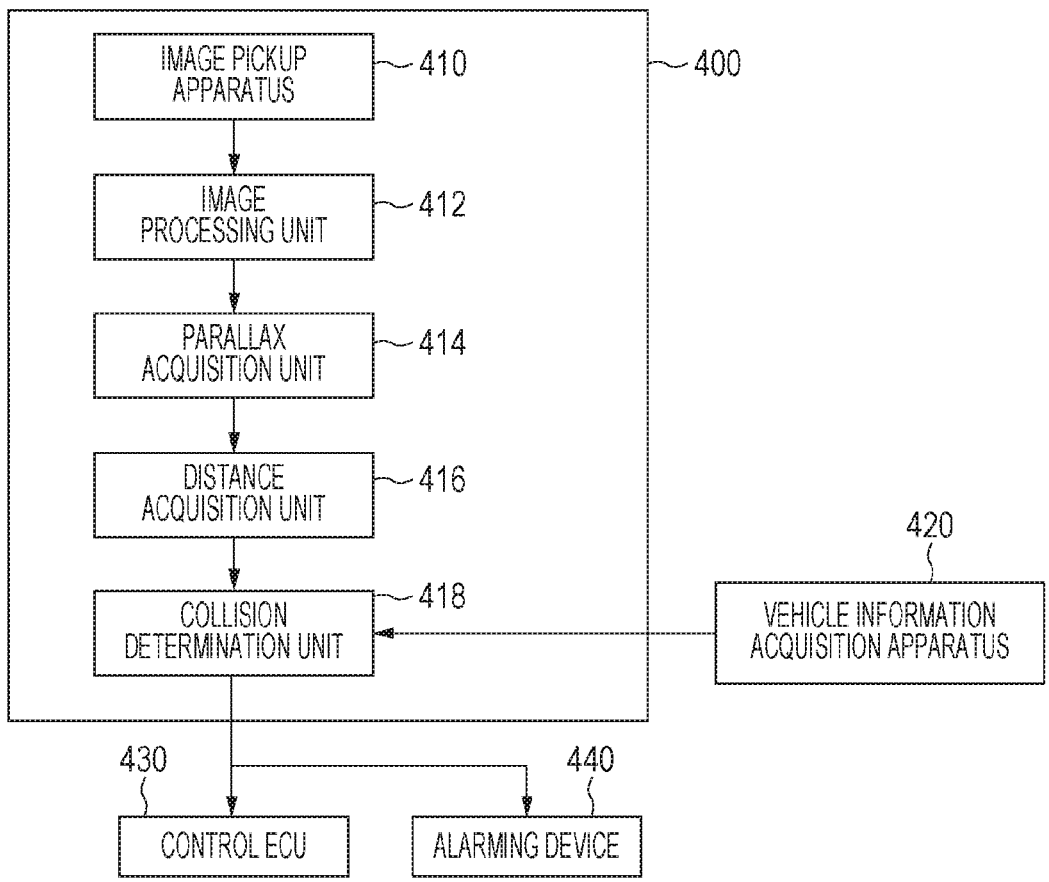
FIG. 7A illustrates an example of an image pickup system related to an on-vehicle camera.
Figure 7B:
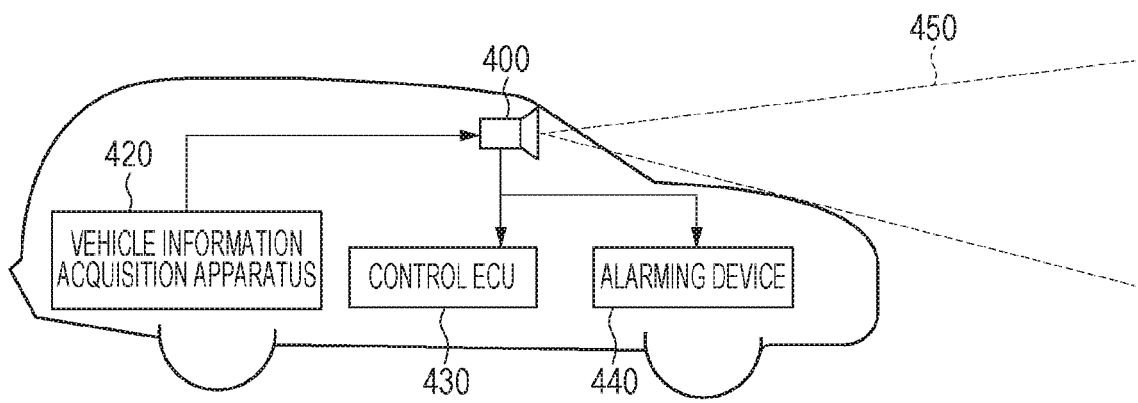
FIG. 7B is a schematic view illustrating an example of a moving object including the on-vehicle camera.

FIGS. 7A and 7B illustrate configurations of an image pickup system and a moving object according to this embodiment.

FIG. 7A illustrates an example of an image pickup system 400 related to an on-vehicle camera. The image pickup system 400 includes an image pickup apparatus 410. The image pickup apparatus 410 is any one of the photoelectric conversion apparatuses according to the above embodiments. The image pickup system 400 includes an image processing unit 412, which is a processor for performing image processing on a plurality of image data acquired by the image pickup apparatus 410, and a parallax acquisition unit 414, which is a processor for calculating the parallax (parallax image phase difference) from the plurality of image data acquired by the image pickup apparatus 410. The image pickup system 400 also includes a distance acquisition unit 416, which is a processor for calculating the distance to a subject based on the calculated parallax, and a collision determination unit 418, which is a processor for determining the possibility of collision based on the calculated distance. The parallax acquisition unit 414 and the distance acquisition unit 416 are examples of information acquisition units for acquiring information such as information about the distance to a subject. That is, distance information is information about the parallax, the amount of de-focusing, the distance to a subject, and so on. The collision determination unit 418 may determine the possibility of collision by using any one of these types of distance information. The above processors may be fabricated using specially designed hardware or general-purpose hardware that performs arithmetic operations based on software modules. The processors may be fabricated using a field programmable gate array (FPGA), an application specific integrated circuit (ASIC), or a combination thereof.

The image pickup system 400 is connected with a vehicle information acquisition apparatus 420 and acquires vehicle information such as vehicle speed, yaw rate, and steering angle. The image pickup system 400 is also connected with a control ECU 430, which is a controller that outputs a control signal for exerting a braking force on a vehicle based on the result of determination by the collision determination unit 418. That is, the control ECU 430 is an example of a moving object control unit for controlling a moving object based on distance information. The image pickup system 400 is also connected with an alarming device 440 that gives an alarm to a driver based on the result of determination by the collision determination unit 418. For example, when the possibility of collision is determined to be high by the collision determination unit 418, the control ECU 430 performs vehicle control for avoiding a collision or reducing damages, for example, by applying a brake, releasing an accelerator, or reducing an engine output. The alarming device 440 warns a user, for example, by raising an alarm such as a sound, displaying alarm information on a screen of, for example, a car navigation system, or vibrating a sheet belt or a steering wheel.

According to this embodiment, the image pickup system 400 captures an image of the surroundings, for example, the front or the back of a vehicle. FIG. 7B illustrates the image pickup system 400 that captures an image of a vehicle front (an imaging area 450). The vehicle information acquisition apparatus 420 activates the image pickup system 400 and send an instruction thereto to perform image capturing. By using any one of the photoelectric conversion apparatuses according to the above embodiments as the image pickup apparatus 410, the image pickup system 400 according to this embodiment can achieve distance measurement with higher accuracy.

While the above description has been made in the context of control to prevent a collision with another vehicle, the above embodiments are also applicable, for example, to control for autonomous driving by following another vehicle and control for autonomous driving without moving out of a traffic lane. Furthermore, the image pickup system is applicable not only to vehicles such as automobiles but also to, for example, moving objects (transport equipment) such as ships, aircraft, and industrial robots. Examples of moving devices in such moving objects (transport equipment) include various moving units such as engines, motors, wheels, and propellers. In addition to such moving objects, the image pickup system is broadly applicable to apparatuses that use object recognition, such as intelligent transportation systems (ITS).

EXAMPLES

The present disclosure will now be described in more detail with reference to examples, but other examples may be used without departing from the spirit of the invention.

Example 1 and Comparative Example 1

In these examples, the photoelectric conversion element illustrated in FIG. 1 was produced as described below. A substrate 1 whose first-electrode-side surface was insulated with a silicon oxide film was provided, and a TiN film serving as a first electrode 2 and a titanium oxide $TiO_2$ film serving as a first interface layer 3 were each formed by a sputtering method. A PbS quantum dot dispersion prepared in advance was applied onto the first interface layer 3 by a spin coating method. Thereafter, a ligand solution containing benzenedithiol (1,4-BDT), an organic ligand with a short molecular chain length, was applied in the same manner to form a photoelectric conversion layer 4. That is, the inorganic ligand was applied in the liquid phase in advance, and the organic ligand was applied in the solid phase. The photoelectric conversion layer 4 formed was dried by being left to stand overnight in a glove box in a nitrogen atmosphere (oxygen concentration: 1 ppm or less, water concentration: 1 ppm or less). Molybdenum oxide $MoO_3$ serving as a second interface layer 5 was formed on the photoelectric conversion layer 4 by a vacuum evaporation method. Tin-containing indium oxide ITO in the form of a transparent conductive film serving as a second electrode 6 was formed on the second interface layer 5 by a sputtering method.

In Example 1, in the above process, the conditions of addition of the inorganic ligand was adjusted when the PbS quantum dot dispersion was prepared, and a quantum dot produced such that the molar percentage of the inorganic ligand was higher than the molar percentage of the organic ligand was used. The element produced in Example 1 is referred to as a photoelectric conversion element 1.

In Comparative Example 1, a quantum dot produced such that the molar percentage of the inorganic ligand was lower than the molar percentage of the organic ligand was used. The element produced in Comparative Example 1 is referred to as a photoelectric conversion element 2.

The halogen atom to organic ligand ratio on a quantum dot surface was measured using TOF-SIMS analysis. Specifically, a PHI nano TOF II manufactured by Ulvac-Phi, Incorporated was used as a TOF-SIMS analyzer, and $Bi_3^{++}$ was used as a primary ion. The primary ion acceleration voltage was 30 kV, and the secondary ion polarity was evaluated for positive and negative.

Figure 3:
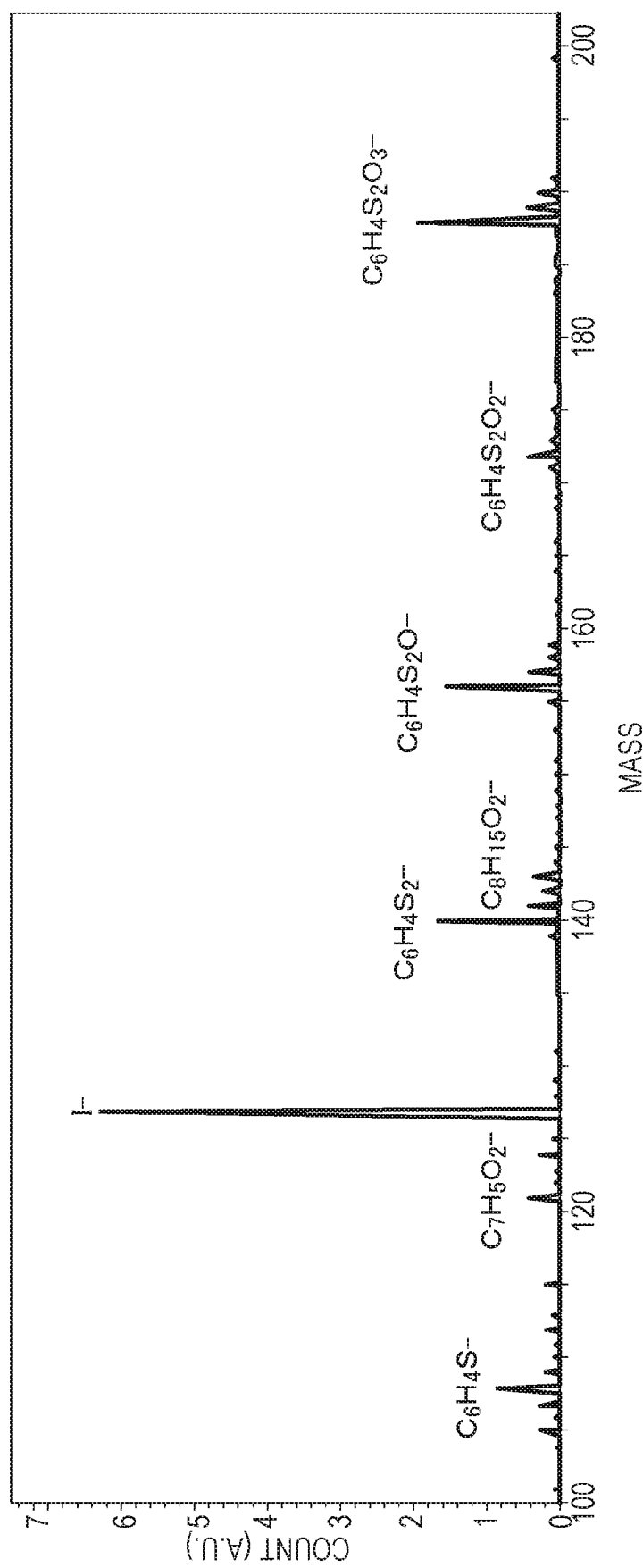
FIG. 3 shows the results of Time-of-Flight Secondary Ion Mass Spectrometry (TOF-SIMS) analysis of a quantum dot of an Example of the present disclosure.

FIG. 3 shows the results of TOF-SIMS analysis of the surface of the quantum dot used for the photoelectric conversion element 1.

For the photoelectric conversion element 1, the count of iodine ions $I^-$ was 6.2, whereas the count of organic compound ions $C_6H_4S_2^-$ was 1.8. That is, the molar percentage of the inorganic ligand is estimated to be 77.5%. For peak intensity, the maximum peak among the peaks attributed to inorganic particles, that is, the peak attributed to iodine ions was at least three times the peak attributed to the organic compound ions, that is, $C_6H_4S_2^-$.

For the photoelectric conversion element 2, the count of iodine ions $I^-$ was 1.6, whereas the count of organic compound ions $C_6H_4S_2^-$ was 6.0. That is, the molar percentage of the inorganic ligand is estimated to be 21.1%.

Electrical Properties

The photoelectric conversion elements produced were evaluated for electrical conductivity by using a semiconductor parameter analyzer. First, the voltage applied to the electrodes were swept between −5 and 5 V with no light on the photoelectric conversion element to obtain I-V characteristics under dark conditions. The current value obtained in a state where a bias of +2 V was applied was employed as a dark current value Id.

The photocurrent value obtained in a state where monochrome light (radiation intensity: 5 μW/cm$^2$) was applied to the photoelectric conversion element was evaluated. In the measurement, the wavelength of the monochrome light was varied in increments of 5 nm in the range of 300 nm to 1200 nm. The increase in current compared to the dark current at the time when light having a wavelength of 600 nm was applied was used as a photocurrent Ip. To examine the heat resistance of the photoelectric conversion element, the photoelectric conversion element was heated at 150° C. for one hour in the atmosphere after completion. Table 1 shows initial values after completion of the photoelectric conversion elements and values after heating in the atmosphere. The photoelectric conversion element 1 achieved a high external quantum efficiency, and no great changes were observed after heating in the atmosphere.

This is explained by the fact that in the photoelectric conversion element 1, the molar percentage of the inorganic ligand on a quantum dot surface is higher than the molar percentage of the organic ligand on the quantum dot surface, and thus the inorganic ligand sufficiently covers defects on the quantum dot surface. By sufficiently sealing surface defects of the quantum dots with iodine I, a halogen atom, photocurrent density dependent on surface defects of the quantum dots was improved, and a photoelectric conversion element having high photosensitivity was provided.

TABLE 1

| | Ligand ratio | Timing of measurement | Photo-current (A/cm$^2$) | Dark current Id (A/cm$^2$) | External quantum efficiency (600 nm) |
|---|---|---|---|---|---|
| Photoelectric conversion element 1 | Organic < inorganic | Initial | 1.50 × 10$^{-6}$ | 9.40 × 10$^{-9}$ | 62% |
| | | After heating | 1.50 × 10$^{-6}$ | 9.50 × 10$^{-9}$ | 62% |
| Photoelectric conversion element 2 | Organic > inorganic | Initial | 9.70 × 10$^{-7}$ | 9.60 × 10$^{-9}$ | 40% |
| | | After heating | 9.70 × 10$^{-7}$ | 9.00 × 10$^{-9}$ | 40% |

Example 2 and Comparative Example 2

In Example 2, a photoelectric conversion element was produced in the same manner as in Example 1 except that a drying step was performed after the photoelectric conversion layer formation. In the drying step performed after the photoelectric conversion film 4 was formed, heating was performed for 30 minutes at 150° C. as a temperature for drying solvent remaining in the quantum dot aggregate, or as a solution drying temperature for drying the ligand solution after the ligand exchange step. The heating was performed in a nitrogen atmosphere containing oxygen. Specifically, the drying step was performed in an environment in which the oxygen concentration in a glove box was 0.1 ppm or more and 1% or less. The surface of the quantum dots is the uppermost surface of a semiconductor material, and a bond not binding to any ligand is a dangling bond. The dangling bond forms a crystal lattice defect level which may cause carrier trapping which has an influence on the electrical conductivity of the photoelectric conversion film, but by slightly oxidizing the surface of the quantum dots, the dangling bond can be sealed, and the crystal lattice defect level can be reduced.

Figure 4:
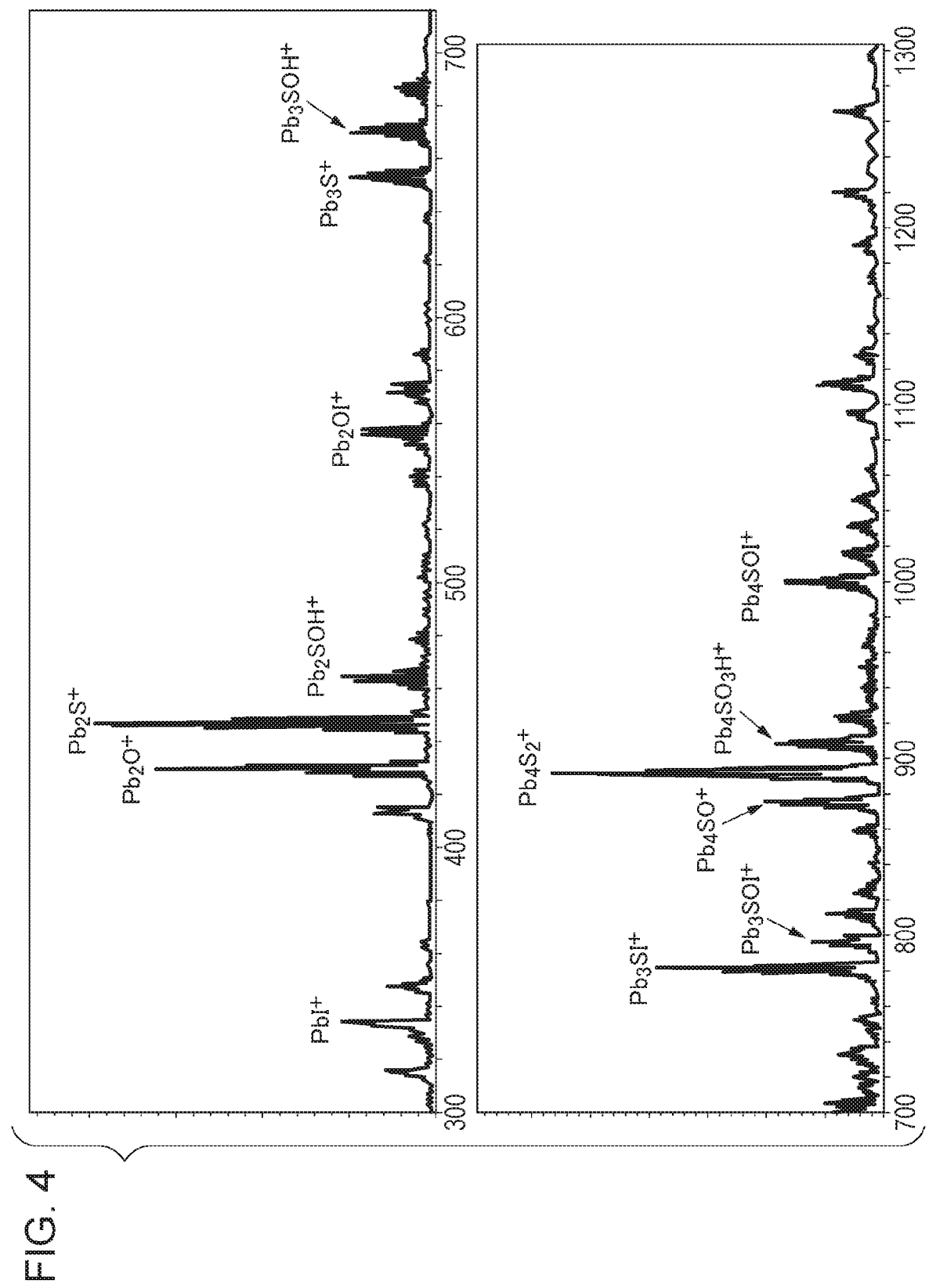
FIG. 4 shows the results of TOF-SIMS analysis (positive secondary ion) of a quantum dot according to an embodiment of the present disclosure.
Figure 5:
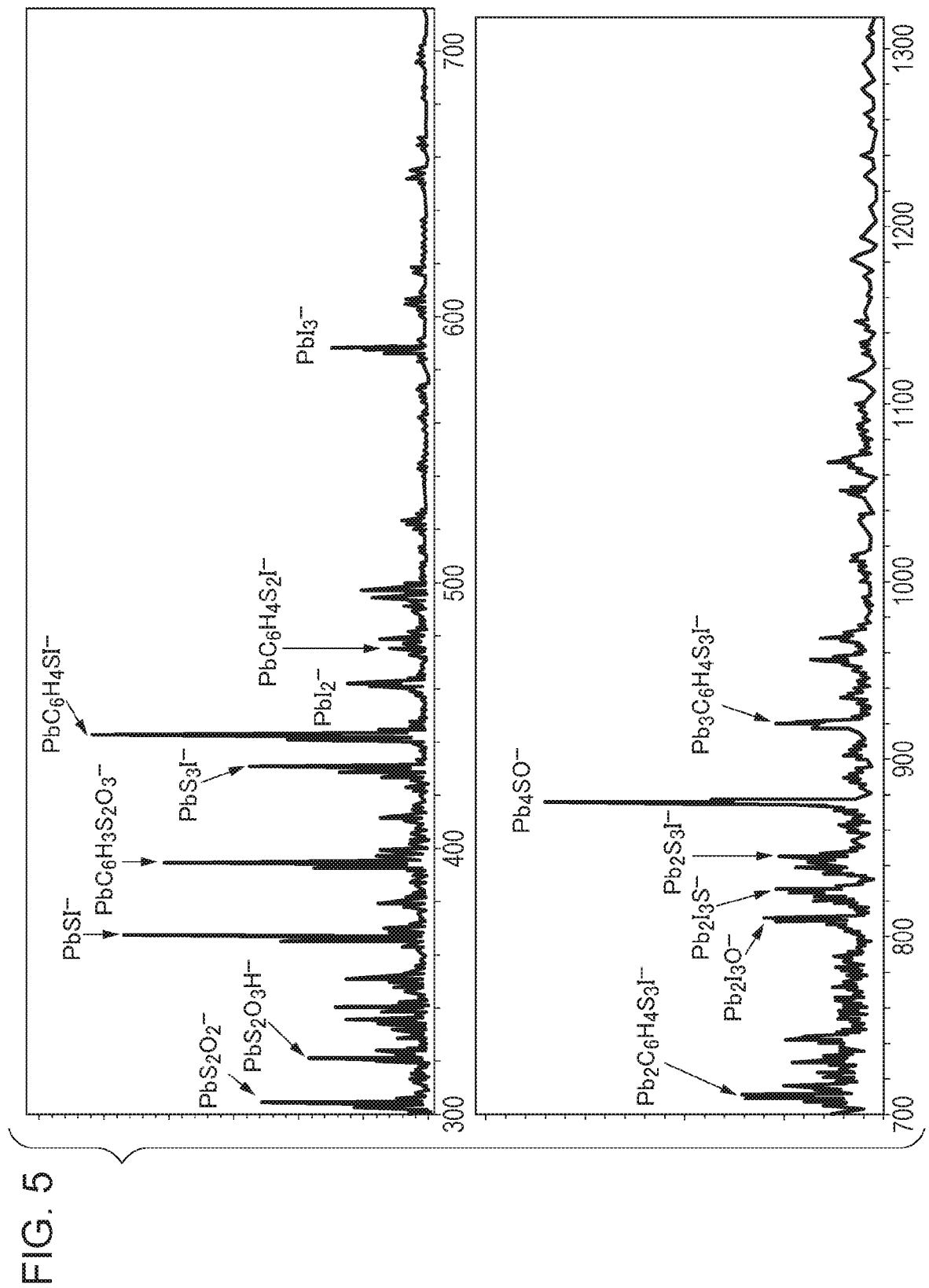
FIG. 5 shows the results of TOF-SIMS analysis (negative secondary ion) of the quantum dot according to an embodiment of the present disclosure.

The measurement of the oxidation state of the quantum dot surface was performed using the same TOF-SIMS analysis as in Example 1. FIG. 4 shows the results of the TOF-SIMS analysis (positive secondary ion). The quantum dot surface contains $Pb_3SOI^+$ and $Pb_4SOI^+$ as well as $Pb_3SP$ containing iodine I. Due to the presence of iodine I in a part where the surface of PbS nanoparticles constituting the quantum dot is oxidized, surface defects remaining after oxidation are repaired by the halogen. The ratio of $Pb_3SI^+$ to $Pb_3SOI^+$ was 2.0:0.7. FIG. 5 shows the results of the TOF-SIMS analysis (negative secondary ion). The quantum dot surface contains benzene rings such as $PbC_6H_4SI^-$ and $PbC_6H_3S_2O_3^-$ as well as $PbSI^-$ containing iodine I.

$C_6H_4S_2O^-$, $C_6H_4S_2O_3^-$, and $C_6H_4S_2O_4^-$ are also contained in large amounts, although their peaks are not specified. These peaks are attributed to the organic ligand 1,4-BDT and indicate that some thiol groups are oxidized. This oxidation is caused by oxygen from external environment, and thus 1,4-BDT acts as a sacrificial oxidation agent for capturing oxygen and serves to reduce the oxidation of the surface of nanoparticles constituting the core of the quantum dot. The benzene rings also serve as hopping sites through which carriers are transported, and thus oxidizing the benzene rings can also reduce dark current.

It is to be understood that the above-described embodiments are intended to merely illustrate specific examples for implementing the present disclosure, and should not be construed as limiting the technical scope of the present invention. In other words, the present disclosure can be implemented in various ways without departing from the technical idea or main features of the present disclosure.

Advantageous Effects

According to the present disclosure, a quantum dot having a high photocurrent density can be provided.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-044266, filed Mar. 11, 2019, and Japanese Patent Application No. 2019-210867, filed Nov. 21, 2019, which are hereby incorporated by reference herein in their entirety.

What is claimed is:

1. A quantum dot comprising:
an inorganic particle; and
an organic ligand and an inorganic ligand on a surface of the inorganic particle,
wherein a molar percentage of the inorganic ligand relative to a total amount of the inorganic ligand and the organic ligand is 25% or more and 99.8% or less.

2. The quantum dot according to claim 1, wherein the molar percentage of the inorganic ligand relative to the total amount of the inorganic ligand and the organic ligand is 25% or more and 98% or less.

3. The quantum dot according to claim 1, wherein the molar percentage of the inorganic ligand relative to the total amount of the inorganic ligand and the organic ligand is 75% or more.

4. The quantum dot according to claim 1, wherein the inorganic ligand has a halogen atom.

5. The quantum dot according to claim 1, wherein the organic ligand has at least two cross-linking structures.

6. The quantum dot according to claim 5, wherein the cross-linking structures are selected from a thiol group and a hydroxyl group.

7. The quantum dot according to claim 1, wherein the organic ligand is selected from the group consisting of 1,3-benzenedithiol, 1,4-benzenedithiol, 3-mercaptobenzoic acid, and 4-mercaptobenzoic acid.

8. The quantum dot according to claim 1, wherein the inorganic particle is a particle containing Pb.

9. A photoelectric conversion element comprising:
a first electrode;
a second electrode; and
a photoelectric conversion layer disposed between the first electrode and the second electrode,
wherein the photoelectric conversion layer includes the quantum dot according to claim 1.

10. The photoelectric conversion element according to claim 9, wherein the photoelectric conversion layer includes at least a first quantum dot and a second quantum dot, and the first quantum dot and the second quantum dot are cross-linked through the organic ligand.

11. The photoelectric conversion element according to claim 9, wherein the photoelectric conversion layer includes a plurality of layers stacked on top of each other, and at least one of the plurality of layers includes the quantum dot.

12. A light receiving element comprising:
the photoelectric conversion element according to claim 9;
a reading circuit that reads an electric charge from the photoelectric conversion element; and
a signal processing circuit that receives the electric charge from the reading circuit and performs signal processing on the electric charge.

13. A photoelectric conversion apparatus comprising:
an optical system including a plurality of lenses; and
a light receiving element that receives light that has passed through the optical system,
wherein the light receiving element is the light receiving element according to claim 12.

14. A moving object comprising:
a body provided with the photoelectric conversion apparatus according to claim 13; and
a moving unit configured to move the body.

15. A quantum dot comprising:
an inorganic particle; and
an organic ligand and an inorganic ligand on a surface of the inorganic particle,
wherein when a peak intensity of the inorganic particle is used as a reference, a height of a maximum peak attributed to the inorganic ligand as determined by Time-of-Flight Secondary Ion Mass Spectrometry (TOF-SIMS) is at least three times a height of a maximum peak attributed to the organic ligand as determined by TOF-SIMS.

16. A method for producing a quantum dot including an inorganic particle and including an organic ligand and an inorganic ligand on a surface of the inorganic particle, the method comprising:
  applying the inorganic ligand and the organic ligand such that a molar percentage of the inorganic ligand is higher than a molar percentage of the organic ligand.

17. The method for producing a quantum dot according to claim 16, wherein an amount of the inorganic ligand added relative to a total amount of the inorganic ligand added and the organic ligand added is 25% or more and 99.8% or less.

18. The method for producing a quantum dot according to claim 16, wherein the inorganic ligand is applied in a liquid phase, and the organic ligand is applied in a solid phase.

19. A method for producing a photoelectric conversion element, comprising:
  a step of providing a first electrode;
  a step of forming a photoelectric conversion layer on the first electrode by application of a quantum dot produced by the method for producing a quantum dot according to claim 16; and
  a step of forming a second electrode on the photoelectric conversion layer.

20. The method for producing a photoelectric conversion element according to claim 19, further comprising a step of oxidizing a surface of the quantum dot.

* * * * *